United States Patent [19]

Abe

[11] Patent Number: 5,192,985
[45] Date of Patent: Mar. 9, 1993

[54] SEMICONDUCTOR LIGHT-EMITTING ELEMENT WITH LIGHT-SHIELDING FILM

[75] Inventor: Hirohisa Abe, Kitakyushu, Japan

[73] Assignee: Kabushiki Kaisha Toshiba, Kawasaki, Japan

[21] Appl. No.: 819,858

[22] Filed: Jan. 13, 1992

[30] Foreign Application Priority Data

Jan. 16, 1991 [JP] Japan .................................. 3-3433

[51] Int. Cl.⁵ ............................................ H01L 33/00
[52] U.S. Cl. ....................................... 257/13; 372/48; 372/50; 257/91; 257/95; 257/98
[58] Field of Search ........................ 357/17, 16, 55, 52, 357/52 C, 45; 372/45, 46, 48, 49, 50

[56] References Cited

U.S. PATENT DOCUMENTS

| | | | |
|---|---|---|---|
| 4,100,508 | 7/1978 | Wittke | 372/49 |
| 4,803,695 | 2/1989 | Yamamoto et al. | 372/49 X |

FOREIGN PATENT DOCUMENTS

| | | | |
|---|---|---|---|
| 0546786 | 1/1979 | Japan | 357/17 |
| 59-121989 | 7/1984 | Japan | 372/49 |
| 63-73572 | 4/1988 | Japan | 357/17 |
| 0171187 | 3/1989 | Japan | 357/17 |

*Primary Examiner*—William Mintel

*Attorney, Agent, or Firm*—Finnegan, Henderson, Farabow, Garrett and Dunner

[57] ABSTRACT

A semiconductor light-emitting element includes a current pinching type semiconductor light-emitting element main body, which utitlizes light extracted from a surface parallel to a light-emitting layer, and a light-shielding film, which is locally or entirely coated on a side surface of the semiconductor light-emitting element main body to be elelctrically insulated therefrom. A method of manufacturing a semiconductor light-emitting element, includes the steps of preparing a wafer by sequentially stacking and forming a current blocking layer, a first cladding layer, an active layer, a second cladding layer, and a first ohmic electrode on one surface of a substrate, and forming a second ohmic electrode on the other surface of the substrate, forming a resist film on the major surface of the wafer, forming a plurality of grooves reaching at least the first cladding layer at predetermined positions on the resist layer, coating an electrical insulating film on the resist film including the grooves, and coating a light-shielding layer on the electrical insulating film, removing the electrical insulating film, the light-shielding film, and the resist film so as to leave the electrical insulating film and the light-shielding film in portions of the grooves, and cutting the wafer at the portions of the grooves.

1 Claim, 3 Drawing Sheets

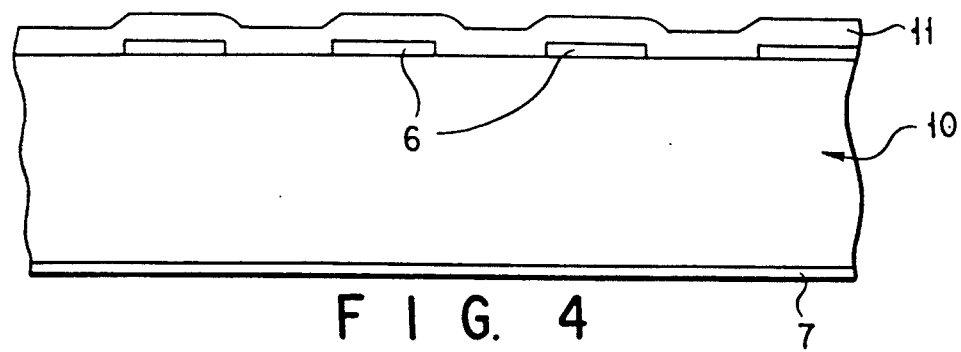
F I G. 4
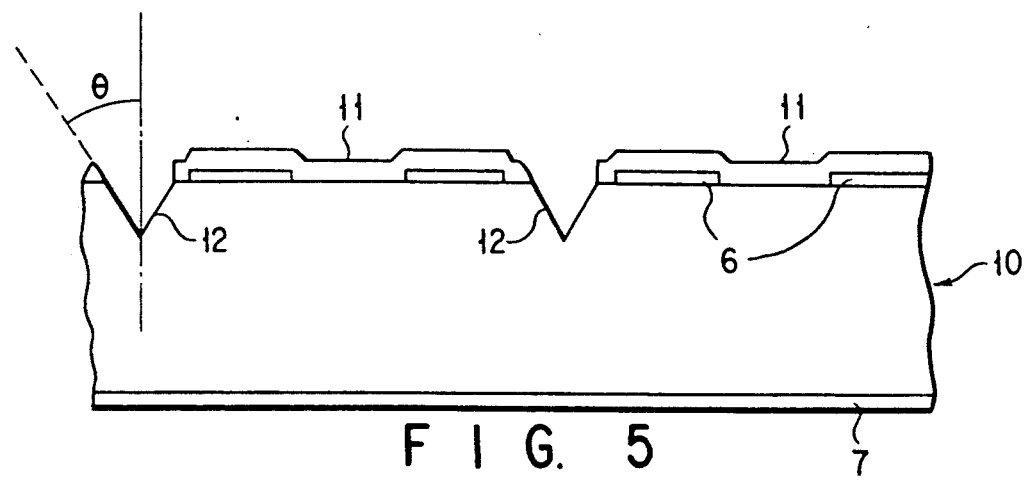
F I G. 5
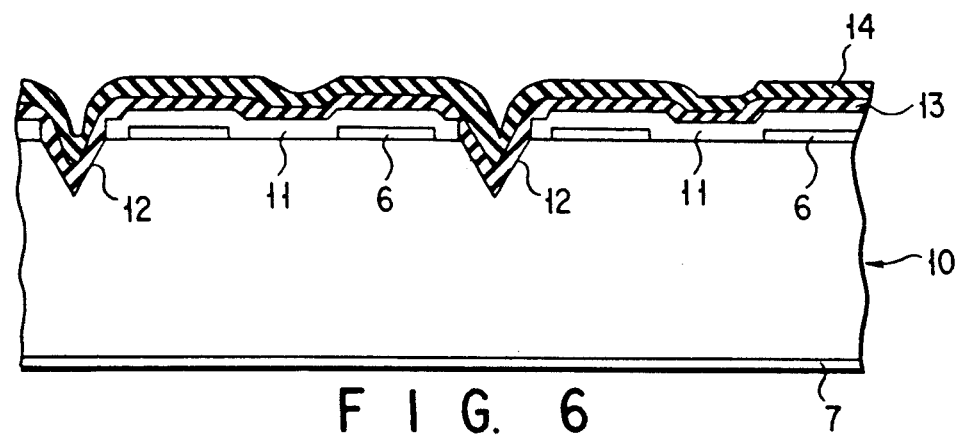
F I G. 6
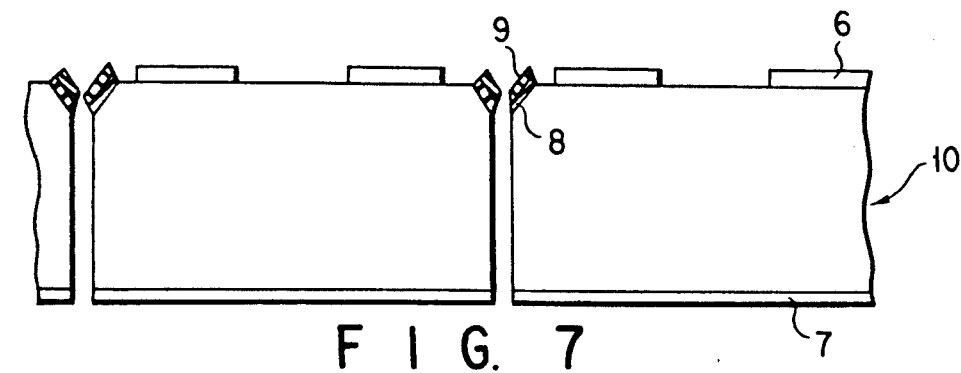
F I G. 7

SEMICONDUCTOR LIGHT-EMITTING ELEMENT WITH LIGHT-SHIELDING FILM

BACKGROUND OF THE INVENTION

1. Field of the Invention

The present invention relates to a current pinching type semiconductor light-emitting element suitably used in, e.g., an auto-focus light source for a camera, and a method of manufacturing the same.

2. Description of the Related Art

Recently, cameras tend to have auto-focus functions. In a ranging (distance measurement) operation to an object, for example, the principle of triangulation using light is employed. As a light source for the ranging operation, an LED as a semiconductor light-emitting element is used. One of characteristics and a current pinching type LED chip, and an enclosure difficult for a normal LED to meet this requirement, and a current pinching type LED chip, and an enclosure having satisfactorily optically designed lenses must be combined.

FIG. 1 shows a typical example of the current pinching type LED chip. An n-type GaAs current blocking layer 22, a p-type $GaAl_{0.25}As_{0.75}$ cladding layer 23, a p-type GaAs active layer 24, an n-type $GaAl_{0.25}As_{0.75}$ cladding layer 25, and an n-type ohmic electrode 26 are sequentially formed on the upper surface of a p-type GaAs substrate 21. Furthermore, a p-type ohmic electrode 27 is formed on the lower surface of the p-type GaAs substrate 21.

In an operation mode, a current is pinched by the current blocking layer 22, and is concentrated at the central portion of the active layer 24. Light emitted upon recombination in the active layer 24 is transmitted through the cladding layer 25, and is radiated outside the chip from an opening portion of the ohmic electrode 26. FIG. 2 is a plan view of this chip.

Normally, a portion, at the side of the substrate 21, of this chip is fixed to a frame or a stem using a conductive resin, and the ohmic electrode 26 on the cladding layer 25 is connected by bonding to the lead post of the frame or stem through a thin Au line. Therefore, a bonding region 28 surrounded by a dotted circle in FIG. 2 requires at least an area according to the bonding technique.

Since a so-called III-V Group compound semiconductor used in a GaAlAs-based infrared LED is a very expensive material as compared to Si, the chip area is decreased as much as possible to attain a low-cost structure.

However, since this LED chip has a more complicated structure than that of a normal chip, and is expensive, further miniaturization of the chip must be realized. A light-extraction opening portion 29 must have a predetermined area for satisfying required electrical and optical characteristics. In addition, as described above, the minimum bonding region 28 is required. Therefore, the remaining portion, i.e., a portion 30 surrounded by an alternate long and short dashed line in FIG. 2, may be omitted.

As shown in FIG. 1, however, some light components 31 of light emitted from a portion (current concentrated portion) of the active layer 24 propagate in the lateral direction, and leak from the side surface of the chip. This phenomenon is called "light leakage", and becomes a cause for impairing characteristics when the chip is used in an auto-focus light source for a camera. As the cladding layer 25 becomes thicker, current concentration is reduced, and light is also emitted from a portion near the chip edge of the active layer 24, thus increasing a light leakage portion. In order to avoid this, the light-emitting portion is separated from the chip edge by a certain distance. According to the experiments of the present inventors, the distance must be at least 130 μm.

Therefore, in addition to the light-extraction opening portion 29 (light-emitting portion), and the bonding region 28, an area for preventing light leakage is also required. The portion 30 surrounded by the alternate long and short dashed line serves as light leakage prevention region. As a result, many restrictions are imposed on reduction or miniaturization of the chip.

SUMMARY OF THE INVENTION

It is an object of the present invention to provide a semiconductor light-emitting element, which can prevent light leakage to omit the light leakage prevention area required in the conventional structure, thereby attaining a compact and low-cost structure of a chip, and a method of manufacturing the same.

A semiconductor light-emitting element according to the present invention comprises a current pinching type semiconductor light-emitting element main body, which utilizes light extracted from a surface parallel to a light-emitting layer, and a light-shielding film, which is locally or entirely coated on a side surface of the semiconductor light-emitting element main body so as to be electrically insulated therefrom.

Furthermore, the semiconductor light-emitting element main body comprises a current blocking layer formed at a predetermined position on one surface of a substrate, a first cladding layer formed to cover the current blocking layer, an active layer formed on the first cladding layer, a second cladding layer formed on the active layer, a first ohmic electrode formed at a predetermined position on the second cladding layer, and a second ohmic contact electrode formed on the other surface of the substrate.

A method of manufacturing a semiconductor light-emitting element according to the present invention comprises the steps of:

preparing a wafer by sequentially stacking and forming a current blocking layer, a first cladding layer, an active layer, a second cladding layer, and a first ohmic electrode on one surface of a substrate, and forming a second ohmic electrode on the other surface of the substrate;

forming a resist film on the major surface of the wafer;

forming a plurality of grooves reaching at least the first cladding layer at predetermined positions on the resist layer;

coating an electrical insulating film on the resist film including the grooves, and coating a light-shielding layer on the electrical insulating film;

removing the electrical insulating film, the light-shielding film, and the resist film so as to leave the electrical insulating film and the light-shielding film in the groove portions; and cutting the wafer at the groove portions.

Therefore, according to the present invention, since the light-shielding film is coated on the side surface of the element main body, light leakage can be prevented, and a portion required for preventing light leakage in the conventional structure can be omitted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

FIG. 4 is a sectional view showing a process of a method of manufacturing a semiconductor light-emitting element according to the embodiment of the present invention;

FIG. 5 is a sectional view showing another process of the method of manufacturing a semiconductor light-emitting element according to the embodiment of the present invention;

FIG. 6 is a sectional view showing still another process of the method of manufacturing a semiconductor light-emitting element according to the embodiment of the present invention; and FIG. 7 is a sectional view showing still another process of the method of manufacturing a semiconductor light-emitting element according to the embodiment of the present invention.

DETAILED DESCRIPTION OF THE PREFERRED EMBODIMENTS

Figure 3:
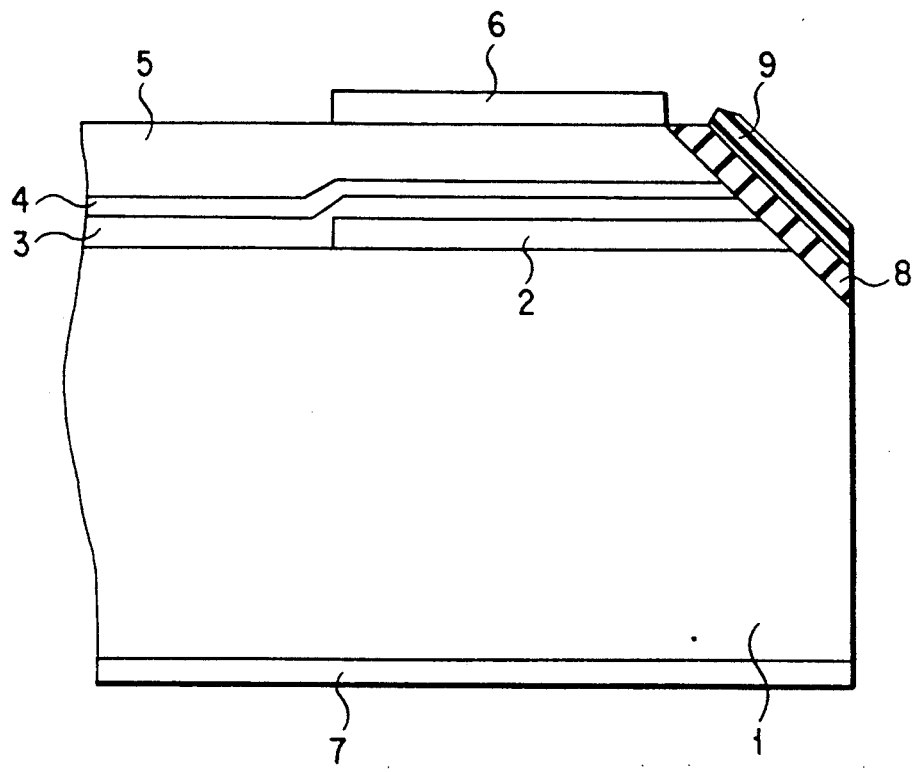
FIG. 3 is sectional view showing a semiconductor light-emitting element according to an embodiment of the present invention.

A semiconductor light-emitting element according to the present invention has a structure as shown in FIG. 3. An n-type GaAs current blocking layer 2 is formed at a predetermined position on the upper surface of a p-type GaAs substrate 1. A p-type $GaAl_{0.25}As_{0.75}$ cladding layer 3 is formed to cover the n-type GaAs current blocking layer 2. A p-type GaAs active layer 4 is formed on the p-type $GaAl_{0.25}As_{0.75}$ cladding layer 3. The p-type GaAs active layer 4 serves as a light-emitting layer. An n-type $GaAl_{0.25}As_{0.75}$ cladding layer 5 is formed on the active layer 4.

An n-type ohmic electrode 6 is formed at a predetermined position on the n-type $GaAl_{0.25}As_{0.75}$ cladding layer 5. A p-type ohmic electrode 7 is formed on the lower surface of the p-type GaAs substrate 1.

Furthermore, according to the present invention, a portion of the side surface of the semiconductor light-emitting element is obliquely notched. A light-shielding film 9 for shielding light is coated on the oblique surface of the element through, e.g., an $SiO_2$ electrical insulating film 8. In this embodiment, for example, an $SiO_2$ film is used as the electrical insulating film 8, and an Al film is used as the light-shielding film 9.

A method of manufacturing the semiconductor light-emitting element according to the present invention will be described below with reference to FIGS. 4 to 7.

As shown in FIG. 4, primarily, a wafer 10 is prepared in such a manner that the n-type GaAs current blocking layer 2, the p-type $GaAl_{0.25}As_{0.75}$ cladding layer 3, the p-type GaAs active layer 4, the n-type $GaAl_{0.25}As_{0.75}$ cladding layer 5, and the n-type ohmic electrode 6 are formed on the upper surface of the p-type GaAs substrate 1, and the p-type ohmic electrode 7 (these layers and electrodes are shown in FIG. 3) is formed on the lower surface of the p-type GaAs substrate 1. A resist film 11 is formed on the major surface of the wafer 10. In this case, the resist film 11 is formed to have a thickness of about 1 $\mu$m for the purpose of convenience in the following processes.

As shown in FIG. 5, a plurality of grooves 12 having a triangular section are then formed at predetermined positions of the wafer by dicing. In this case, each groove 12 must reach at least the p-type $GaAl_{0.25}As_{0.75}$ cladding layer 3, and an angle $\theta$ preferably falls within a range of about 60° to 20°. If this angle exceeds 60°, the chip area must be large so as to form the grooves 12 to reach the p-type $AaAl_{0.25}As_{0.75}$ cladding layer 3, and such a structure is not suitable for the object of the present invention. If the angle is smaller than 20°, it is difficult to form the electrical insulating film 8 and the light-shielding film 9. Therefore, the angle is preferably set to be about 45°.

As shown in FIG. 6, an $SiO_2$ film 13 serving as the electrical insulating film 8 is coated by, e.g., CVD on the resist film 11 including the grooves 12 to have a thickness of up to about 5,000 Å. An Al film 14 is coated by sputtering on the $SiO_2$ film 13 to have a thickness of about 2,000 Å.

Finally, as shown in FIG. 7, the $SiO_2$ film 13 and the Al film 14 on the resist film 11 are removed by a lift-off method so as to leave the $SiO_2$ film 13 and the Al film 14 in only the portions of the grooves 12. These films serve as the electrical insulating film 8 and the light-shielding film 9. When the wafer is cut at the portions of the grooves 12, the semiconductor light-emitting element shown in FIG. 3 can be completed.

In the above-described embodiment, the insulating film 8 and the light-shielding film 9 are coated on a portion of the side surface of the element. However, these films may be coated on the entire side surface, as needed.

In the above-described embodiment, the light-shielding film 9 is coated via the insulating film 8 to form a two-layered structure. If a light-shielding film having electrical insulating characteristics is employed, this light-shielding film having electrical insulating characteristics can be coated while omitting the insulating film 8. In this case, a single-layered structure is formed.

Furthermore, in the above-described embodiment, for example, the $SiO_2$ film is used as the electrical insulating film 8, and the Al film is used as the light-shielding film 9. However, the present invention is not limited to these films, as a matter of course.

The light-shielding film may be coated on the vertical side surface, and this is possible if a means such as plasma CVD is used. This structure is effective for miniaturization of the element.

Figure 1:
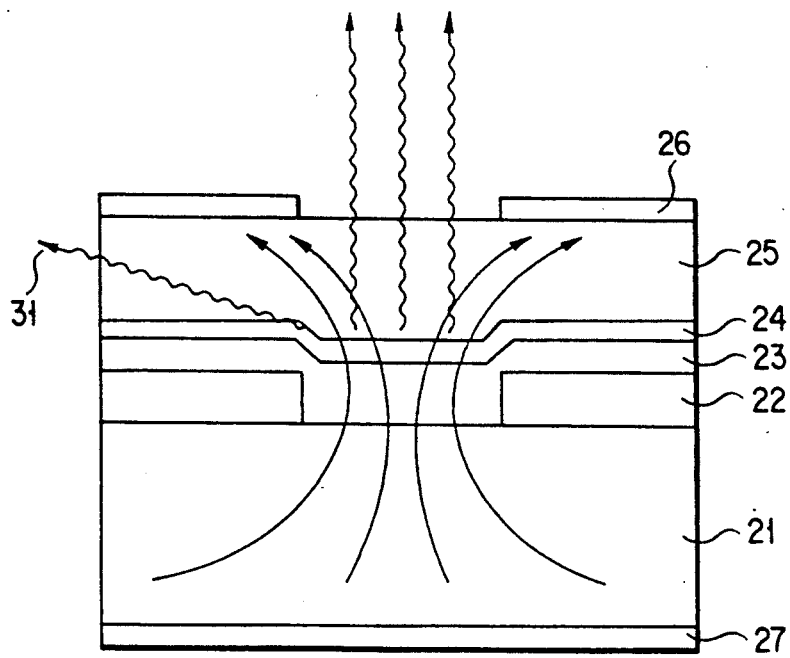
FIG. 1 is a sectional view showing a conventional semiconductor light-emitting element.
Figure 2:
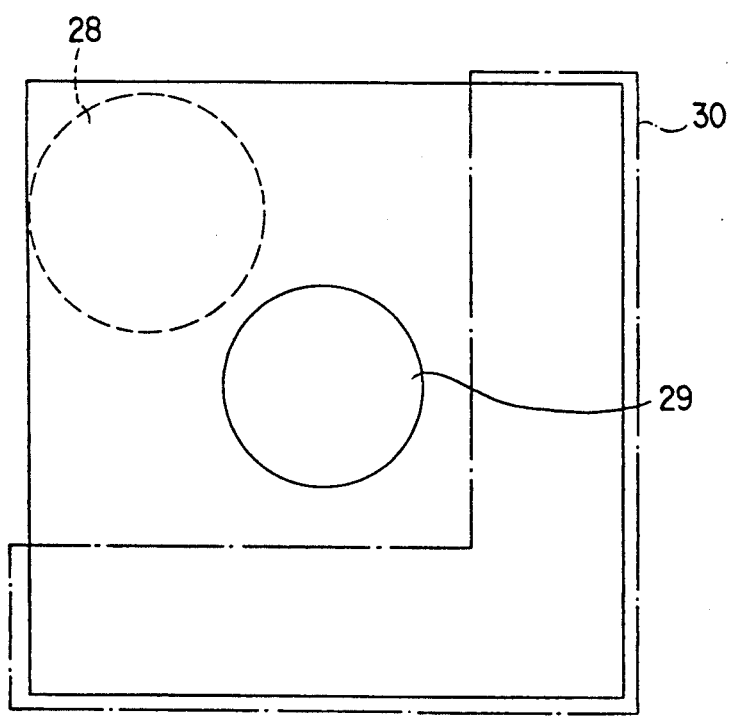
FIG. 2 is a plan view showing the conventional semiconductor light-emitting element.

As described above, according to the present invention, since the light-shielding film is coated on the side surface of the element, light leakage can be prevented. As a result, a portion required for preventing light leakage (the portion 30 surrounded by the alternate long and short dashed line in FIG. 2) can be omitted. As a result, miniaturization of the element can be attained, and cost can be reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor light-emitting element, characterized by comprising:

a current blocking layer formed in a predetermined position on one surface of a substrate;

a first cladding layer formed to cover said current blocking layer;

an active layer formed on said first cladding layer;

a second cladding layer formed on said active layer;

a first ohmic electrode formed in a predetermined position on said second cladding layer;

a second ohmic electrode formed on another surface of said substrate; and a light-shielding film adhered to and electrically isolated from at least one side surface including an edge of said substrate, said current blocking layer, said first cladding layer, said active layer and second cladding layer.

* * * * *

UNITED STATES PATENT AND TRADEMARK OFFICE
CERTIFICATE OF CORRECTION

PATENT NO. : 5,192,985
DATED : March 09, 1993
INVENTOR(S) : Hirohisa Abe

It is certified that error appears in the above-indentified patent and that said Letters Patent is hereby corrected as shown below:

Title page, [57] Abstract, line 7, change "elelctrically" to --electrically--.

Signed and Sealed this

Twenty-second Day of February, 1994

Attest:

BRUCE LEHMAN

Attesting Officer

Commissioner of Patents and Trademarks